(12) United States Patent
Park et al.

(10) Patent No.: US 10,012,771 B2
(45) Date of Patent: Jul. 3, 2018

(54) POLARIZING PLATE AND DISPLAY DEVICE COMPRISING SAME

(71) Applicant: LG CHEM, LTD., Seoul (KR)

(72) Inventors: Jaehong Park, Daejeon (KR); Tae Ho Kim, Daejeon (KR); Dong Hoon Chung, Daejeon (KR); Min Woo Hwang, Daejeon (KR); Deok Woo Park, Daejeon (KR); Jeong Yeun Kim, Daejeon (KR); Woo Yong Cho, Daejeon (KR); Hyung Il Yang, Daejeon (KR)

(73) Assignee: LG CHEM, LTD., Seoul (KR)

( * ) Notice: Subject to any disclaimer, the term of this patent is extended or adjusted under 35 U.S.C. 154(b) by 145 days.

(21) Appl. No.: 14/426,946

(22) PCT Filed: Jun. 17, 2014

(86) PCT No.: PCT/KR2014/005283
§ 371 (c)(1),
(2) Date: Mar. 9, 2015

(87) PCT Pub. No.: WO2014/204164
PCT Pub. Date: Dec. 24, 2014

(65) Prior Publication Data
US 2015/0276992 A1 Oct. 1, 2015

(30) Foreign Application Priority Data

Jun. 18, 2013 (KR) .................. 10-2013-0069865

(51) Int. Cl.
*G02B 1/14* (2015.01)
*G02B 1/11* (2015.01)
(Continued)

(52) U.S. Cl.
CPC ................. *G02B 1/14* (2015.01); *G02B 1/08* (2013.01); *G02B 5/305* (2013.01); *G02B 5/3041* (2013.01);
(Continued)

(58) Field of Classification Search
CPC ... G02B 1/14; G02B 1/11; G02B 1/08; G02B 5/3033; G02B 5/3041; G02B 5/305
See application file for complete search history.

(56) References Cited

U.S. PATENT DOCUMENTS 6,055,096 A    4/2000  Michihata et al.
6,934,081 B2 * 8/2005  Higashio ............. B29C 71/0072
                                              264/1.31
(Continued)

FOREIGN PATENT DOCUMENTS

JP    9166711 A       6/1997
JP    2005128097 A    5/2005
(Continued)

OTHER PUBLICATIONS

Machine Translation of JP 2009-104062. Retrieved Nov. 11, 2017.*
(Continued)

*Primary Examiner* — Prashant J Khatri
(74) *Attorney, Agent, or Firm* — Dentons US LLP

(57) ABSTRACT

Provided are a polarizing plate including a polarizing film and protective films provided on both sides of the polarizing film and a display device including the same.

7 Claims, 5 Drawing Sheets

(51) Int. Cl.
    *G02B 5/30*    (2006.01)
    *G02B 1/08*    (2006.01)
    *G02F 1/1335*  (2006.01)
    *H01L 51/52*   (2006.01)
    *G02B 1/16*    (2015.01)

(52) U.S. Cl.
    CPC .......... *G02F 1/133528* (2013.01); *G02B 1/11* (2013.01); *G02B 1/16* (2015.01); *G02B 5/3033* (2013.01); *H01L 51/5293* (2013.01); *Y10T 428/24942* (2015.01)

(56) References Cited

U.S. PATENT DOCUMENTS

| | | |
|---|---|---|
| 9,019,608 B2 | 4/2015 | Hirata et al. |
| 9,151,882 B2 | 10/2015 | Yamamoto et al. |
| 2002/0015807 A1 | 2/2002 | Sugino et al. |
| 2003/0151706 A1 | 8/2003 | Sugino et al. |
| 2006/0268200 A1* | 11/2006 | Ohgaru .............. C09K 19/2007 349/97 |
| 2008/0100780 A1 | 5/2008 | Suzuki et al. |
| 2008/0113119 A1 | 5/2008 | Tsujiuchi et al. |
| 2008/0211997 A1 | 9/2008 | Chen et al. |
| 2009/0251644 A1 | 10/2009 | Park et al. |
| 2010/0118399 A1 | 5/2010 | Umemoto et al. |

FOREIGN PATENT DOCUMENTS

| | | | |
|---|---|---|---|
| JP | 205-148567 A | | 6/2005 |
| JP | 2009-037223 A | | 2/2009 |
| JP | 2009104062 A | * | 5/2009 |
| JP | 2009-545767 A | | 12/2009 |
| JP | 4546017 B2 | | 7/2010 |
| JP | 2012-13989 A | | 1/2012 |
| JP | 2012-048046 A | | 3/2012 |
| KR | 1020010113559 A | | 12/2001 |
| KR | 1020070091994 A | | 9/2007 |
| KR | 1020090006759 A | | 1/2009 |
| KR | 10-2010-0089871 A | | 8/2010 |
| KR | 1020110097078 A | | 8/2011 |
| TW | 200923441 A | | 6/2009 |

OTHER PUBLICATIONS

Office Action of Korean Patent Office in Appl'n No. 10-2013-0069865, dated Aug. 27, 2015.

Office Action of Korean Patent Office in Appl'n No. 10-2016-0011682 dated Jan. 31, 2017.

* cited by examiner

[Figure 1]
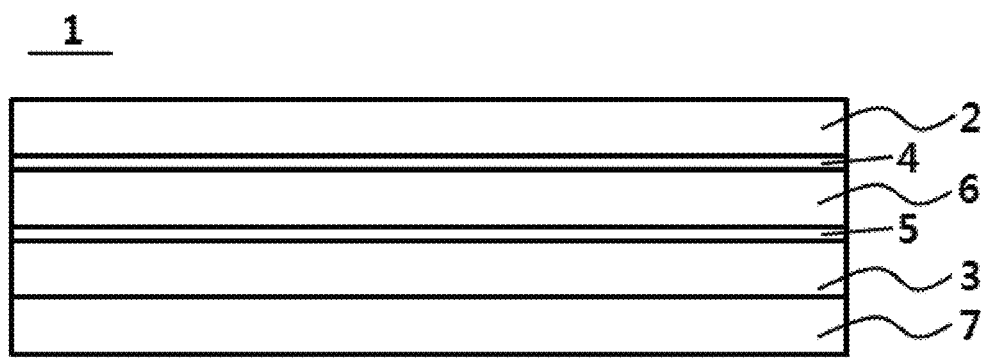

[Figure 2]
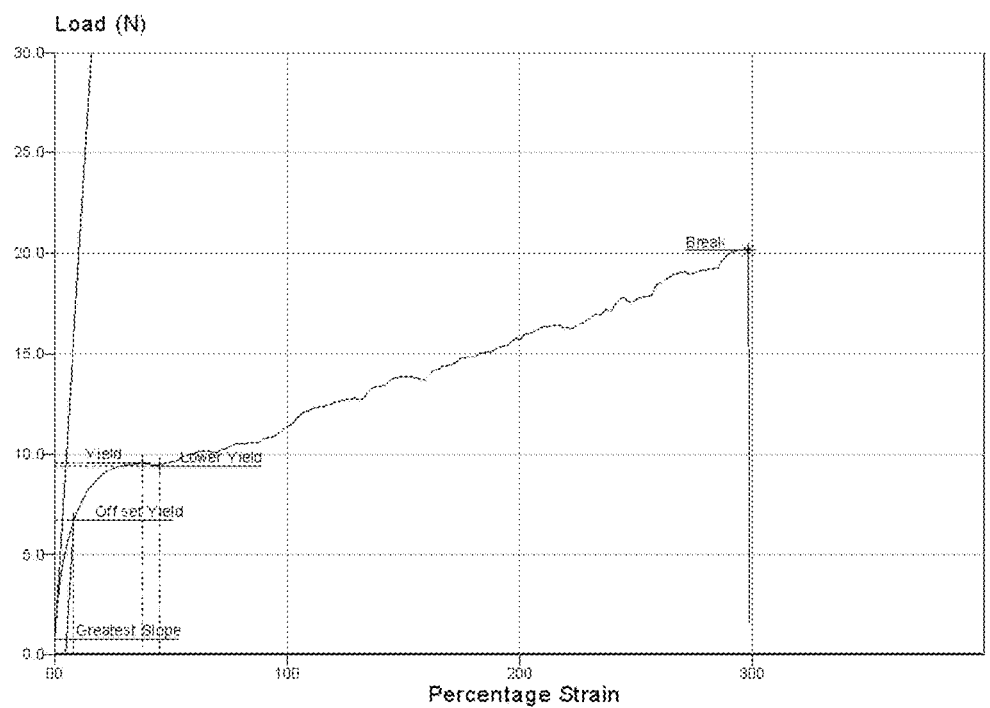

[Figure 3]
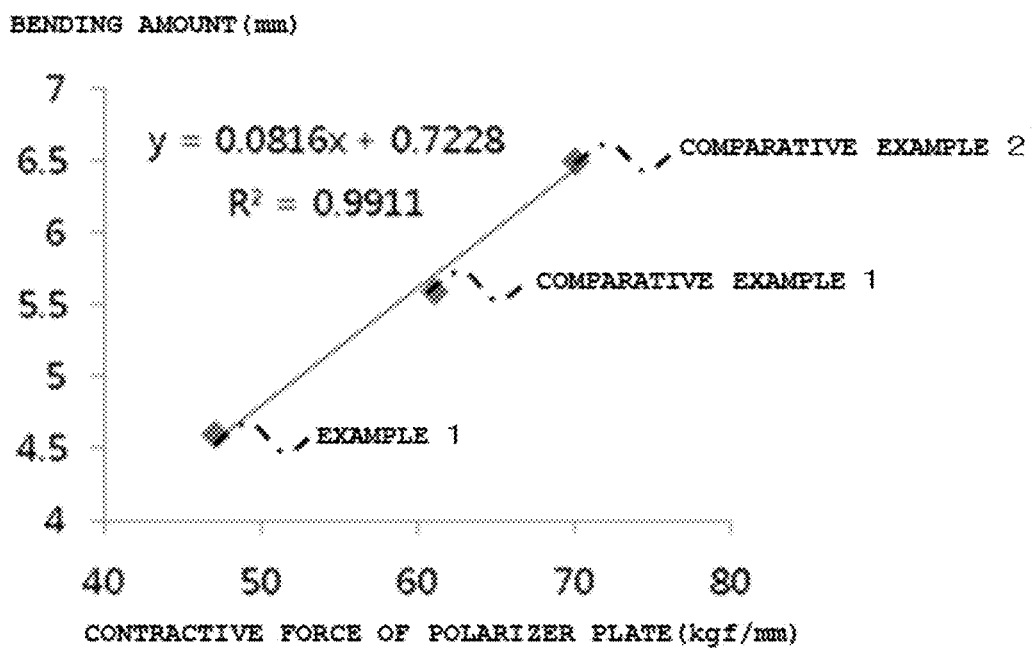

[Figure 4]
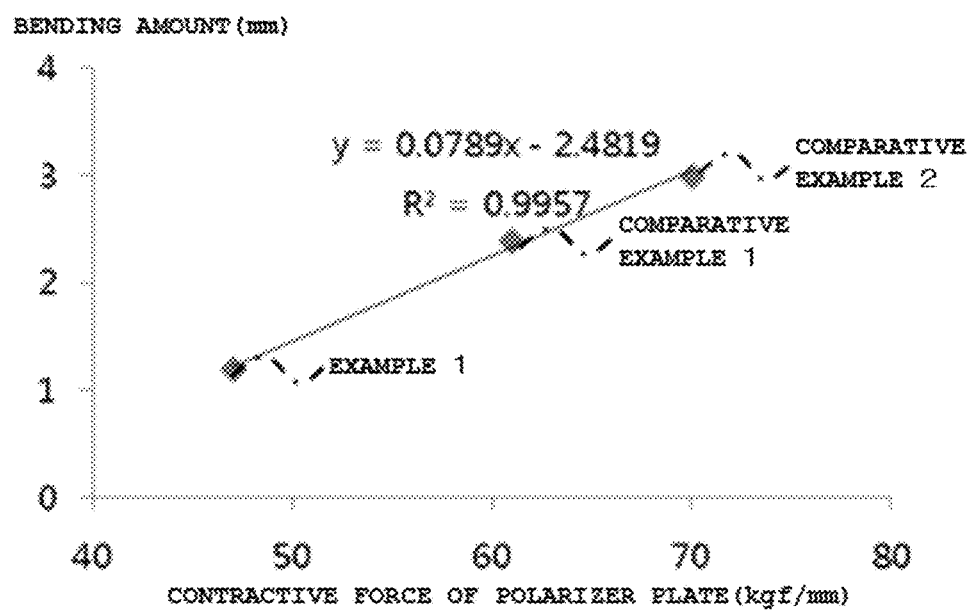

[Figure 5]
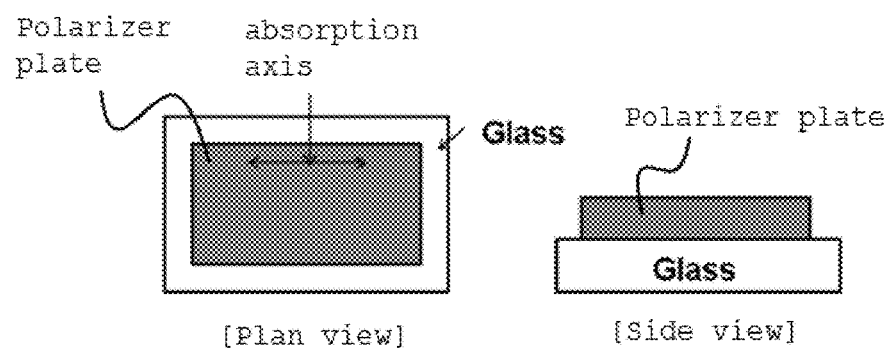
[Figure 6]
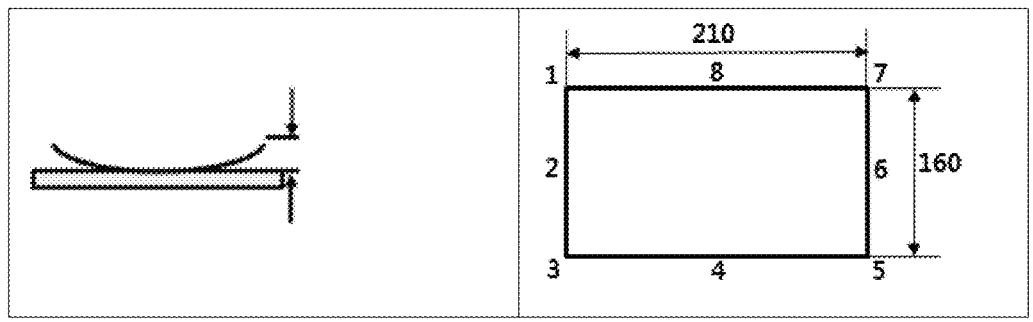

POLARIZING PLATE AND DISPLAY DEVICE COMPRISING SAME

TECHNICAL FIELD

This application is a National Stage Entry of International Application No. PCT/KR2014/005283, filed Jun. 17, 2014, and claims priority to and the benefit of Korean Patent Application No. 10-2013-0069865 filed with the Korean Intellectual Property Office on Jun. 18, 2013, all of which are hereby incorporated by reference in their entirety for all purposes as if fully set forth herein.

The present invention relates to a polarizing plate including a polarizing film and protective films provided on both sides of the polarizing film, and a display device including the same.

BACKGROUND ART

Recently, with the remarkable development of information technology (IT) industry, the liquid crystal display (LCD) industry which is one of the core components of the IT industry has been also developed as a medium for transferring various information in the modern industrial society developed to be a highly developed information age.

A polarizing plate is one of the main components of a flat panel display such as an LCD or an organic EL. A liquid crystal display panel has a configuration in which polarizing films are attached to both sides of a liquid crystal cell. FIG. 1 schematically illustrates a general shape of the polarizing plate. Referring to FIG. 1, a polarizing plate 1 includes a central polarizing film 6, and protective films 2 and 3 attached to both sides of the polarizing film 6 by adhesive layers 4 and 5. The protective films 2 and 3 are disposed at upper and lower sides of the polarizing film 6 to prevent the damage of the polarizing film 6.

DISCLOSURE

Technical Problem

The present invention has been made in an effort to provide a polarizing plate including: a polarizing film; and protective films provided on both sides of the polarizing film, and a display device including the same.

Technical Solution

An exemplary embodiment of the present invention provides a polarizing plate including: a polarizing film; a first protective film provided on one side of the polarizing film; and a second protective film provided on the other side of the polarizing film, in which a contractive force in at least one direction of the first protective film and the second protective film is 13 kgf or less per width of 1 mm.

Another exemplary embodiment of the present invention provides a display device including the polarizing plate.

Yet another exemplary embodiment of the present invention provides a liquid crystal display including the polarizing plate.

Advantageous Effects

According to the exemplary embodiment of the present invention, there is an advantage in that remaining force on a polarizing plate including a protective film is small by using the protective film having a low contractive force.

Further, there is an advantage in that a bending phenomenon in which a glass substrate is bent is reduced when the polarizing plate including the protective film having the low contractive force is used together with the glass substrate.

DESCRIPTION OF DRAWINGS

FIG. 1 is a schematic diagram illustrating a general shape of a polarizing plate.

FIG. 2 is an example of a percentage strain-load graph for measuring a contractive force in the present invention.

FIGS. 3 and 4 are graphs analyzing a correlation between a contractive force (X axis) and bending (Y axis) of a polarizing plate according to an exemplary embodiment of the present invention.

FIG. 5 is a plan view and a side view of a sample in Experimental Example 1.

FIG. 6 is a drawing for measuring a lifting degree from the granite plate in Experimental Example 1.

MODE FOR INVENTION

Hereinafter, exemplary embodiments of the present invention will be described in detail.

An exemplary embodiment of the present invention provides a protective film for a polarizing plate having a low contractive force in at least one direction.

In the polarizing plate manufactured through a series of processes, the applied force during the processes may remain, and as a result, a strain in which the polarizing plate is contracted may occur under a high-temperature condition or a high temperature and humidity condition. Particularly, as an element in the liquid crystal cell is thinly formed, the used glass is thinner and influence of the strain force by which the polarizing plate is to be contracted on the liquid crystal cell has been increased, and as a result, a defect due to distortion of the liquid crystal cell is increased. Accordingly, a bending phenomenon in which the liquid crystal cell is bent needs to be reduced by reducing the contractive force by which the polarizing plate is contracted and stained.

In order to reduce the bending under a high-temperature or high-temperature and humidity condition, companies of the polarizing plate conducted a lot of researches for reducing the contractive force. However, under the high-temperature or high-temperature and humidity condition, it was very difficult to quantify the contractive force of the polarizing plate. The applicants conducted efforts to find factors which represent the contractive force, and as a result, measured the tensile strength under the room-temperature and humidity condition and found that values obtained by converting a unit from kgf/mm2 to kgf/mm represent the contractive force.

The applicants obtained a result of FIG. 3 as a result of a bending experiment after the polarizing plate attached to the glass substrate is left in a chamber at 80° C. for 24 hours, that is, an experiment of measuring a bending degree. Referring to FIG. 3, it can be seen that as the contractive force of the polarizing plate is decreased, the bending phenomenon is reduced.

Further, the applicants found that the contractive force of the polarizing plate itself is proportional to a sum of respective contractive forces of the layers configuring the polarizing plate. Accordingly, the applicants found that the bending phenomenon may be reduced as the contractive force of the protective film for the polarizing plate is smaller.

An exemplary embodiment of the present invention provides a protective film for a polarizing plate of which a contractive force in at least one direction is 13 kgf per width of 1 mm.

In the present invention, since the bending phenomenon in which the substrate is bent may be further reduced as the contractive force of the protective film for the polarizing plate is smaller, the lowest limit of the contractive force is not particularly limited, but if necessary, the contractive force in at least one direction may be more than 0 kgf to 13 kgf or less per width of 1 mm.

The protective film for the polarizing plate may include at least one of a cycloolefin polymer(COP)-based film, an acryl-based film, a triacetylcellulose (TAC)-based film, a cycloolefin copolymer (COC)-based film, a polynorbornene (PNB)-based film, and a polyethylene terephtalate (PET)-based film.

The protective film for the polarizing plate may include a cycloolefin polymer (COP)-based film of which a contractive force in at least one direction is 10 kgf or less per width of 1 mm.

In the present invention, since the bending phenomenon in which the substrate is bent may be further reduced as the contractive force of the protective film for the polarizing plate is smaller, the lowest limit of the contractive force is not particularly limited, but if necessary, the contractive force in at least one direction may be more than 0 kgf to 10 kgf or less per width of 1 mm.

The present invention provides a polarizing plate including a polarizing film; a first protective film provided on one side of the polarizing film; and a second protective film provided on the other side of the polarizing film.

The present invention provides a polarizing plate including a protective film having a low contractive force.

The present invention provides a polarizing plate including a protective film having a low contractive force in an absorption-axial direction or a transmission-axial direction.

The present invention provides a polarizing plate including a polarizing film; a first protective film provided on one side of the polarizing film; and a second protective film provided on the other side of the polarizing film, in which a contractive force in at least one direction of the first protective film and the second protective film is 13 kgf or less per width of 1 mm. In this case, there is an advantage in that a bending phenomenon in which a substrate is bent may be reduced.

In other words, the present invention provides a polarizing plate in which a contractive force in at least one direction of the first protective film is 13 kgf or less per width of 1 mm and which a contractive force in at least one direction of the second protective film is 13 kgf or less per width of 1 mm.

In the present invention, the "at least one direction" may include all directions, and is not particularly limited.

The "at least one direction" may include a machine direction which is a moving direction when the protective film is manufactured or a vertical direction to the machine direction, if necessary.

The "at least one direction" may include a length direction which is a direction in which the protective film is wound on a roll for storing when the protective film is manufactured or a width direction which is a vertical direction to the length direction, if necessary.

The "at least one direction" may include a bending direction of the polarizing plate under a higher-temperature and humidity condition than the condition of the temperature of 25° C. and relative humidity of 50%, if necessary.

In the present invention, the "bending direction of the polarizing plate" means a direction of a line including a dot having a largest length of a vertical line drawn downward from a reference surface among dots at an edge of the polarizing plate. In this case, the direction of the line may be a machine direction including the dot having the largest length of a vertical line drawn downward from the reference surface or a vertical direction to the machine direction including the dot having the largest length of a vertical line drawn downward from the reference surface.

In the present invention, the "higher-temperature and humidity condition than the condition of the temperature of 25° C. and relative humidity of 50%" is not particularly limited if the temperature and the relative humidity are more than 25° C. and 50% and the polarizing plate is bent with respect to the reference surface, respectively. For example, as one Experimental Example of the present invention, a bending amount was measured under a condition of a temperature of 80° C. or under a condition of a temperature of 60° C. and relative humidity 90%.

The "at least one direction" may include at least one of an absorption-axial direction of the polarizing film and a transmission-axial direction of the polarizing film, if necessary.

Here, the contractive force means a force by which the film is strained and restored to an original state. Since it is difficult to measure a force when being actually contracted, the contractive force is estimated by measuring a force required when the film is forcibly stretched (tensioned). That is, the contractive force is represented by a tensile strength, and as a research result, it is determined that the tensile strength may correspond to the contractive force.

In this case, the contractive force (tensile strength) is measured by the following method.

1. In an environment of a room temperature (25° C.) and room humidity (50%), a sample is cut with a width of 10 mm and a length of 150 mm and then installed in a length direction on a universal tester, and any one of both fixed ends is pulled.

2. While the sample is forcibly stretched, a percentage strain and a load applied to the film are simultaneously measured to obtain a percentage strain-load graph like FIG. 2.

3. In the percentage strain-load graph, the contractive force is calculated by the greatest slope among tangential slopes.

In the present invention, there is an advantage in that the contraction of the polarizing plate and the bending phenomenon of the glass are reduced due to a residue force remaining on the protective film by using the protective film having the lower contractive force.

A material and a manufacturing method of the polarizing film are not particularly limited, and may use general material and manufacturing method which are known in the art.

In the exemplary embodiment of the present invention, the polarizing film may be a polyvinylalcohol-based polarizing film.

There is an advantage in that the contractive force of the polarizing film is smaller, the contractive force of the polarizing plate is smaller. There is an advantage in that the contraction of the polarizing plate and the bending phenomenon of the glass are reduced as the contractive force of the polarizing film is smaller.

In the exemplary embodiment of the present invention, since the bending phenomenon in which the substrate is bent may be further reduced as the contractive force in the absorption-axis direction of the polarizing film is smaller, the range of the contractive force is not particularly limited, but the contractive force in the absorption-axial direction of the polarizing film may be more than 0 kgf to 70 kgf or less per width of 1 mm. If necessary, the contractive force in the absorption-axial direction of the polarizing film may be 25 to 45 kgf per width of 1 mm.

In the exemplary embodiment of the present invention, since the bending phenomenon in which the substrate is bent may be further reduced as the contractive force in the transmission-axis direction of the polarizing film is smaller, the range of the contractive force is not particularly limited, but the contractive force in the transmission-axis direction of the polarizing film may be more than 0 kgf to 40 kgf or less per width of 1 mm. If necessary, the contractive force in the transmission-axis direction of the polarizing film may be 5 to 15 kgf per width of 1 mm.

The applicants found that the contractive force is reduced as the thickness of the film is smaller through an experiment of a contractive force according to a thickness.

Accordingly, since the contractive force may be reduced and the bending phenomenon in which the substrate is bent may be further reduced as the thickness of the polarizing film is smaller, the dimensional range of the thickness of the polarizing film is not particularly limited. The thickness of the polarizing film may be more than 0 µm to less than 50 µm, and in this case, there is an advantage in that the bending phenomenon in which the substrate is bent may be reduced. As necessary, the thickness of the protective film may be 5 to 40 µm, and if necessary, may be 10 to 30 µm.

The first protective film is not particularly limited if the first polarizing film has the contractive force within the range of the present invention, and may use general material and manufacturing method which are known in the art.

In the exemplary embodiment of the present invention, the first protective film may include one or more films, and may be manufactured by at least one of a cycloolefin polymer(COP)-based film, an acryl-based film, a triacetylcellulose (TAC)-based film, a cycloolefin copolymer (COC)-based film, a polynorbornene (PNB)-based film, and a polyethylene terephtalate (PET)-based film. In the exemplary embodiment of the present invention, the first protective film may include one or more films, and if necessary, may include a cycloolefin polymer (COP)-based film of which the contractive force is 10 kgf or less per width of 1 mm.

A pressure-sensitive adhesive layer positioned on the first protective film may be included. Here, the "on the first protective film" means an opposite side of a side with the polarizing film based on the first protective film.

The pressure-sensitive adhesive layer is provided so as to be applied to a display device such as a liquid crystal display device.

For example, a surface with the pressure-sensitive adhesive layer is attached to a liquid crystal cell of the liquid crystal display device to be applied to the display device. In this case, the first protective film attached to the liquid crystal cell may have a specific phase difference for viewing angle compensation.

The first protective film may include one or more additives selected from a UV absorber, an anti-blocking agent, a lubricant, an antistatic agent, and a stabilizer, if necessary.

One or more layers of an anti-reflection layer, a low-reflection coating layer, a UV absorbing layer, a brightness enhancing layer, an antistatic coating layer, an antiglare layer, a liquid crystal coating layer, and a hard coat layer may be additionally included on an upper surface or a lower surface of the first protective film, if necessary.

The first protective film and the polarizing film may be attached to each other by an aqueous or non-aqueous adhesive.

In the exemplary embodiment of the present invention, the second protective film may includes one or more films, and may be manufactured by at least one of a cycloolefin polymer(COP)-based film, an acryl-based film, a triacetylcellulose (TAC)-based film, a cycloolefin copolymer (COC)-based film, a polynorbornene (PNB)-based film, and a polyethylene terephtalate (PET)-based film. In the exemplary embodiment of the present invention, the second protective film may include one or more films, and if necessary, may include a cycloolefin polymer (COP) of which the contractive force is 10 kgf or less per width of 1 mm.

The second protective film may include one or more additives selected from a UV absorber, an anti-blocking agent, a lubricant, an antistatic agent, and a stabilizer, if necessary.

One or more layers of an anti-reflection layer, a low-reflection coating layer, a UV absorbing layer, a brightness enhancing layer, an antistatic coating layer, an antiglare layer, a liquid crystal coating layer, and a hard coat layer may be additionally included on an upper surface or a lower surface of the second protective film, if necessary.

The second protective film and the polarizing film may be attached to each other by an aqueous or non-aqueous adhesive.

In the case where the first protective film is attached to the liquid crystal cell by the pressure-sensitive adhesive layer formed on the first protective film, the second protective film is relatively positioned at the outside. As such, the second protective film may include a UV absorber or a UV absorbing layer provided on the upper surface or lower surface of the second protective film.

In the case where the polarizing plates are provided on both sides of the liquid crystal cell, at least one layer of a hard coating layer, a low-reflection coating layer, and an anti glare layer may be additionally provided on the upper surface or lower surface of the second protective film of an upper polarizing plate (the protective film positioned at the outermost side) which is relatively far away from the ground surface based on the liquid crystal cell.

In the case where the polarizing plates are provided on both sides of the liquid crystal cell, a brightness enhancing layer may be additionally provided on the upper surface or lower surface of the second protective film of a lower polarizing plate (the protective film positioned at the outermost side) which is relatively close to the ground surface based on the liquid crystal cell.

The applicants found that the contractive force is reduced as the thickness of the film is smaller through an experiment of a contractive force according to a thickness.

In the present invention, since the bending phenomenon in which the substrate is bent may be further reduced as the thickness of the protective film is smaller, the dimensional range of the thickness of the protective film is not particularly limited. The thickness of the protective film may be more than 0 µm to less than 60 µm, and in this case, there is an advantage in that the bending phenomenon in which the substrate is bent may be reduced.

As necessary, the thickness of the protective film may be 15 to 45 µm, and if necessary, may be 20 to 30 µm.

The thickness of the protective film manufactured by an acryl-based film or a TAC-based film may be 15 to 45 µm. In this case, the contractive force of the protective film manufactured by the acryl-based film or the TAC-based film may be 13 kgf or less per width of 1 mm, and there is an advantage in that the bending phenomenon in which the substrate is bent may be reduced.

Another exemplary embodiment of the present invention provides a display device including the polarizing plate.

The display device may be one of a touch panel, a light emitting diode (LED), an organic light emitting diode (OLED), a liquid crystal display (LCD), and a thin film transistor-liquid crystal display (LCD-TFT).

The thickness of a glass substrate provided in the display device may be 0.1 mm to 0.7 mm, and may be selected according to an applied element.

Yet another exemplary embodiment of the present invention provides a liquid crystal display including the polarizing plate.

The liquid crystal display may include a liquid crystal cell and the polarizing plate provided on one side or both sides of the liquid crystal cell.

In this case, the liquid crystal cell and the polarizing plate may be attached to each other by the pressure-sensitive adhesive layer provided on the first protective film of the polarizing plate.

Hereinafter, the present invention will be described in more detail with reference to Examples and Comparative Examples. However, Examples and Comparative Examples are just to exemplify the present invention, but the present invention is not limited thereto.

EXAMPLES

Example 1

TABLE 1

| Hard coating layer |
|---|
| COP |
| Polarizing film |
| COP |
| Liquid crystal coating layer |
| Pressure-sensitive adhesive layer (PSA) |

The COP-based film having the thickness of 23 μm was used as the first protective film, and the liquid crystal coating layer having the thickness of 1 μm was formed on one side of the first protective film. In the COP-based film formed with the liquid crystal coating layer, the contractive force in the absorption-axial direction is 6 kgf per width of 1 mm, and the contractive force in the transmission-axial direction is 7 kgf per width of 1 mm. The pressure-sensitive adhesive layer having the thickness of 22 μm was formed on the liquid crystal coating layer.

Further, the COP-based film having the thickness of 40 μm was used as the second protective film, and the hard coating layer having the thickness of 7 μm was formed on one side of the second protective film. In the COP-based film formed with the hard coating layer, the contractive force in the absorption-axial direction is 6 kgf per width of 1 mm, and the contractive force in the transmission-axial direction is 6 kgf per width of 1 mm.

Thereafter, like the structure like Table 1, the polarizing plate was manufactured by attaching the first protective film and the second protective film to both sides of the polyvinylalcohol polarizing film of which the thickness is 12 μm, by using a non-aqueous adhesive, respectively.

Comparative Example 1

TABLE 2

| Hard coating layer |
|---|
| Acryl film |
| Polarizing film |
| COP |
| Liquid crystal coating layer |
| Pressure-sensitive adhesive layer (PSA) |

The COP-based film having the thickness of 23 μm was used as the first protective film, and the liquid crystal coating layer having the thickness of 1 μm was formed on one side of the first protective film. In the COP-based film formed with the liquid crystal coating layer, the contractive force in the absorption-axial direction is 6 kgf per width of 1 mm, and the contractive force in the transmission-axial direction is 7 kgf per width of 1 mm. The pressure-sensitive adhesive layer having the thickness of 22 μm was formed on the liquid crystal coating layer.

Further, the acryl-based film having the thickness of 40 μm was used as the second protective film, and the hard coating layer having the thickness of 5 μm was formed on one side of the second protective film. In the acryl-based film formed with the hard coating layer, the contractive force in the absorption-axial direction is 20 kgf per width of 1 mm, and the contractive force in the transmission-axial direction is 19 kgf per width of 1 mm.

Thereafter, like the structure like Table 2, the polarizing plate was manufactured by attaching the first protective film and the second protective film to both sides of the polyvinylalcohol polarizing film of which the thickness is 12 μm, by using a non-aqueous adhesive, respectively.

Comparative Example 2

TABLE 3

| Anti glare layer |
|---|
| Acryl film |
| Polarizing film |
| Acryl film |
| Pressure-sensitive adhesive layer (PSA) |

As the first protective film, the acryl-based film having the thickness of 40 μm was formed. In the acryl-based film, the contractive force in the absorption-axial direction is 16 kgf per width of 1 mm, and the contractive force in the transmission-axial direction is 17 kgf per width of 1 mm.

The pressure-sensitive adhesive layer having the thickness of 22 μm was formed on one side of the first protective film.

Further, the acryl-based film having the thickness of 40 μm was used as the second protective film, and the anti glare layer having the thickness of 5 μm was formed on one side of the second protective film. In the acryl-based film formed with the anti glare layer, the contractive force in the absorption-axial direction is 19 kgf per width of 1 mm, and the contractive force in the transmission-axial direction is 21 kgf per width of 1 mm.

Thereafter, like the structure like Table 3, the polarizing plate was manufactured by attaching the first protective film and the second protective film to both sides of the polyvinylalcohol polarizing film of which the thickness is 12 μm, by using a non-aqueous adhesive, respectively.

Experimental Example 1

Bending Experiment Under Heat-resistance Condition (80° C., 24 Hours)

A sample was manufactured by cutting the polarizing plates manufactured in Example and Comparative Examples with a size of 200 mm×150 mm. In this case, the sample was manufactured so that a length in the absorption-axial direction is large, that is, the length in the absorption-axial direction is 200 mm.

The sample was manufactured by attaching the manufactured polarizing plate with the size of 200 mm×150 mm to the center of a glass substrate with the size of 210 mm×160 mm (thickness of 0.4 mm). Thereafter, the sample attached to the glass substrate was left in a chamber at 80° C. for 24 hours. The sample was removed after being left for 24 hours in the chamber, and then left for 24 hours at a room temperature (25° C., humidity 50%), and the bending was measured.

In this case, a bending degree was measured by placing the sample on a flat granite plate (placing the glass substrate to face the granite plate) and measuring a degree lifted upward from granite plate like FIG. 6 by using a ruler at the following positions 1 to 8, or measured by using a 3D measuring machine. The largest value of distances far away from the granite plate was defined as a bending amount of the polarizing plate. A graph analyzing a correlation between a contractive force (X axis) and a bending amount (Y axis) in a bending direction based on the bending amount is illustrated in FIG. 3.

TABLE 4

|  | Example 1 | Comparative Example 1 | Comparative Example 2 |
|---|---|---|---|
| Film of PSA opposite side | 6 kgf/mm | 20 kgf/mm | 19 kgf/mm |
| Polarizing film | 35 kgf/mm | 35 kgf/mm | 35 kgf/mm |
| Film of PSA side | 6 kgf/mm | 6 kgf/mm | 16 kgf/mm |
| Total (polarizing plate) | 47 kgf/mm | 61 kgf/mm | 70 kgf/mm |
| Bending amount | 4.6 mm | 5.6 mm | 6.5 mm |

Experimental Example 2

Bending Experiment Under a Heat-resistance and Moisture-resistance Condition (60° C., Humidity 90%, 24 Hours)

Experimental Example 2 is the same as the Experimental Example 1, except that the sample attached to the glass substrate is left in a chamber at 60° C. and humidity 90% for 24 hours. The result is illustrated in the following Table 5 and a graph analyzing a correlation between a contractive force (X axis) and a bending (Y axis) in a bending direction based on the result is illustrated in FIG. 4.

TABLE 5

|  | Example 1 | Comparative Example 1 | Comparative Example 2 |
|---|---|---|---|
| Film of PSA opposite side | 6 kgf/mm | 20 kgf/mm | 19 kgf/mm |
| Polarizing film | 35 kgf/mm | 35 kgf/mm | 35 kgf/mm |
| Film of PSA side | 6 kgf/mm | 6 kgf/mm | 16 kgf/mm |
| Total (polarizing plate) | 47 kgf/mm | 61 kgf/mm | 70 kgf/mm |
| Bending amount | 1.2 mm | 2.4 mm | 3.0 mm |

EXPLANATION OF REFERENCE NUMERALS

1: Polarizing plate
2, 3: Protective film
4, 5: Adhesive layer
6: Polarizing film
7: Pressure-sensitive adhesive

The invention claimed is:

1. A polarizing plate, comprising:
a polarizing film; a first protective film provided on one side of the polarizing film; and a second protective film provided on the other side of the polarizing film,
wherein a contractive force in at least one direction of an absorption-axial direction and a transmission-axial direction of the first protective film and the second protective film is 13 kgf or less per width of 1 mm,
wherein each of the first protective film and the second protective film includes a cycloolefin polymer(COP)-based film,
wherein a contractive force in an absorption-axial direction of the polarizing film is more than 0 kgf to 40 kgf or less per width of 1 mm,
wherein a thickness of the polarizing film is in a range of 5 μm to 30 μm, a thickness of the first protective film is more than 0 μm and less than or equal to 23 μm, and a thickness of the second protective film is more than 0 μm and less than or equal to 40 μm, and
wherein the contractive force is measured by the following method:
1) in an environment of a room temperature (25° C.) and room humidity (50%), a sample is cut with a width of 10 mm and a length of 150 mm and then installed in a length direction on a universal tester, and any one of both fixed ends is pulled,
2) while the sample is forcibly stretched, a percentage strain and a load applied to the sample are simultaneously measured to obtain a percentage strain-load graph, and
3) in the percentage strain-load graph, the contractive force is calculated by the greatest slope among tangential slopes.

2. The polarizing plate of claim 1, wherein the polarizing film is a polyvinylalcohol-based polarizing film.

3. The polarizing plate of claim 1, wherein at least one of the first protective film and the second protective film includes a cycloolefin polymer (COP)-based film of which a contractive force is 10 kgf or less per width of 1 mm.

4. The polarizing plate of claim 1, further comprising:
a pressure-sensitive adhesive layer positioned on the first protective film,
wherein the second protective film includes one or more additives selected from a UV absorber, an anti-blocking agent, a lubricant, an antistatic agent, and a stabilizer.

5. The polarizing plate of claim 1, wherein one or more layers selected from an anti-reflection layer, a low-reflection coating layer, a UV absorbing layer, a brightness enhancing layer, an antistatic coating layer, an antiglare layer, a liquid crystal coating layer, and a hard coat layer are additionally included on at least one of the first protective film and the second protective film.

6. A display device including the polarizing plate according to claim 1.

7. A liquid crystal display including the polarizing plate according to claim 1.

* * * * *